United States Patent [19]

Geissberger et al.

[11] Patent Number: 4,832,761
[45] Date of Patent: May 23, 1989

[54] PROCESS FOR MANUFACTURING GALLIUM ARSENIDE MONOLITHIC MICROWAVE INTEGRATED CIRCUITS USING NONPHOTOSENSITIVE ACID RESIST FOR HANDLING

[75] Inventors: Arthur E. Geissberger; Philippe R. Claytor, both of Roanoke, Va.

[73] Assignee: ITT Gallium Arsenide Technology Center, A Division of ITT Corporation, Roanoke, Va.

[21] Appl. No.: 94,042

[22] Filed: Sep. 8, 1987

Related U.S. Application Data

[63] Continuation of Ser. No. 769,285, Aug. 26, 1985, abandoned.

[51] Int. Cl.⁴ .................................... H01L 21/312
[52] U.S. Cl. .................................... 148/33.3; 148/33.1; 148/DIG. 135; 437/184; 437/229; 437/974; 437/925
[58] Field of Search ............. 437/974, 184, 229, 925; 428/901; 148/33.1, 33.3, 33.5, DIG. 135

[56] References Cited

U.S. PATENT DOCUMENTS

| | | | |
|---|---|---|---|
| 3,621,565 | 1/1971 | Sandstrom et al. | 148/DIG. 135 X |
| 3,647,581 | 3/1972 | Mash | 148/DIG. 135 X |
| 3,846,198 | 11/1974 | Wen et al. | 148/DIG. 135 X |
| 3,959,045 | 5/1976 | Antypas | 148/DIG. 135 X |
| 4,025,793 | 5/1977 | Shaw et al. | 250/370 |
| 4,118,857 | 10/1978 | Wong | 29/574 |
| 4,142,925 | 3/1979 | King et al. | 148/175 |
| 4,147,584 | 4/1979 | Garrison et al. | 156/612 |
| 4,293,587 | 10/1981 | Trueblood | 427/90 |
| 4,329,779 | 5/1987 | England | 29/840 |
| 4,621,019 | 1/1986 | Vikesland | 428/901 |

OTHER PUBLICATIONS

"Shipley Microposit FSC Solution", brochure, Shipley Co., Newton, Mass., Jul. 1984.

Primary Examiner—Olik Chaudhuri
Assistant Examiner—T. N. Quach
Attorney, Agent, or Firm—Robert A. Walsh; Thomas N. Twomey; Mary C. Werner

[57] ABSTRACT

A process for manufacturing gallium arsenide microwave circuits makes use of a nonphotosensitive acid resist as an adhesive for holding the "front side" of a gallium arsenide wafer onto a substrate while operations such as etching "via holes" into the wafer are being performed on the "back side" of the wafer. The process comprises front side processing, spinning the nonphotosensitive acid resist onto the frontside of the GaAs wafer, baking the protective acid resist coating onto the wafer, spinning the acid resist onto a substrate, joining the wafer to the substrate, thinning the wafer, and performing backside processing.

3 Claims, 1 Drawing Sheet

PROCESS FOR MANUFACTURING GALLIUM ARSENIDE MONOLITHIC MICROWAVE INTEGRATED CIRCUITS USING NONPHOTOSENSITIVE ACID RESIST FOR HANDLING

This application is a continuation of application Ser. No. 769,285, filed Aug. 26, 1985, now abandoned.

BACKGROUND OF THE INVENTION

The present invention relates to a process for manufacturing gallium arsenide monolithic microwave integrated circuits wherein via holes can be placed in a thin gallium arsenide wafer while the wafer is adhesively held to a substrate, and the adhesive holding the wafer to the substrate can subsequently be easily removed.

Processes are well known in the semiconductor manufacturing art for etching via holes in GaAs wafers using either wet chemicals or dry plasma etching. In these processes wafers are thinned by lapping and chemical polishing to approximately 50 micrometers to 150 micrometers which insures that all of via holes are etched through to the front of the wafer, while none over etch to the extent that they etch out one or more of the front side contact pads causing a failure of the electrical continuity after subsequent back side metallization. Since via formation requires significant amounts of handling after wafer thinning, the known processes include the step of adhesively attaching the thinned GaAs wafer to a substrate. The adhesive agents used to attach the GaAs wafer to the substrate must be capable of withstanding all of the processing steps associated with via fabrication. Wax and photo resists have commonly been used as the adhesive agent in the prior art processes.

A major shortcoming of the aforementioned prior art processes is the difficulty of removing the adhesive agents from the front side of the gallium arsenide wafer after it has been processed. This problem is especially apparent where relatively thick wafers (125 micrometers to 150 micrometers) are used to minimize the loss of monolithic integrated circuits during production. The use of these relatively thick GaAs wafers requires dry etching to achieve the required via hole yield. However, the dry etch process heats the gallium arsenide which causes carbonization of waxes and polymerization of the photoresist. The chemically altered adhesives are then extremely difficult to remove from the front side of the GaAs wafer, and any unremovable residues render the integrated circuit useless.

SUMMARY OF THE INVENTION

It is an object of the present invention to provide a manufacturing process for gallium arsenide integrated circuits which increases the yield of usable processed wafers obtained from a production line.

It is a further object of the present invention to provide a manufacturing process for gallium arsenide integrated circuits wherein adhesives used to hold gallium arsenide wafers to substrates for wafer processing are easily removed after the wafer has been acted upon.

It is still another object of the present invention to provide a manufacturing process for gallium arsenide wafers wherein via holes are placed into the wafers by dry etching, and undesirable residues of the adhesives used to hold the gallium arsenide wafer onto a substrate while the via holes are being etched therein are eliminated.

The above objects are achieved in the present invention by a process which comprises front side processing of a thin gallium arsenide wafer, spinning a nonphotosensitive acid resist onto the front side of the wafer and backing this adhesive onto the wafer, spinning more of the acid resist onto a substrate and placing the wafer on top of the wet substrate with a weight on top, baking again, thinning the wafer, using a mask to etch via holes on the back side of the wafer with a plasma etchant, removing the mask, gold plating the wafer back side, and separating the wafer from the sapphire substrate while removing all adhesive residues.

DETAILED DESCRIPTION OF THE INVENTION

Figure 1:
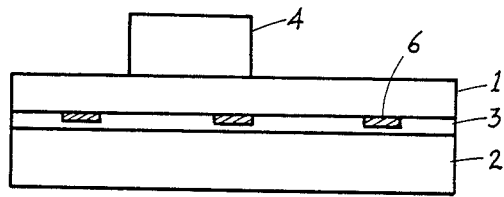
FIG. 1 is an elevational view of a gallium arsenide wafer being adhesively connected to a substrate.

Processing of the GaAs wafers into monolithic microwave integrated circuits begins with the attachment of metal contact pads 6 to the front side of wafer 1. Then the wafer 1 is mounted front side, down onto a sapphire substrate 2 using a nonphotosensitive acidresist 3 as an adhesive as is shown in FIG. 1. The mounting of wafer 1 onto substrate 2 is done by first spinning the adhesive onto the front side of the wafer, then baking the wafer for approximately 40 minutes at approximately 100° C. After the adhesive is baked onto the wafer, more of the adhesive acidresist is spun onto the sapphire substrate and the wafer is then placed on top of the wet substrate with a weight 4 on top as shown in FIG. 1. The wafer is then baked for approximately 5 to 8 hours at approximately 100° C. to harden the adhesive acid resist.

As used herein the term photoresist refers to substances which change their chemical composition upon photographic exposure. A typical use of such a substance would be to coat it onto one side of a semiconductor wafer, mask all part of the surface, expose the masked surface photographically, and then apply a solvent which would take away the exposed photoresist leaving a desired pattern. On the other hand the term acid resist as used herein refers to substances which are impervious to acid. A typical application of such substances is to coat an entire wafer surface for protection against acids. These substances are not generally photosensitive and in this application the term "nonphotosensitive acid resist" is used to emphasize that the acid resists do not change their chemical composition upon photographic exposure.

Figure 2:
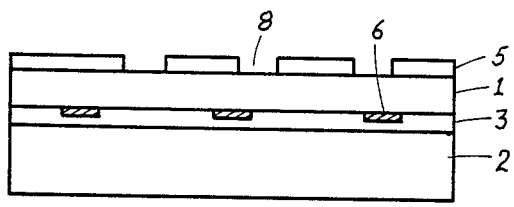
FIG. 2 is an elevational view of the gallium arsenide wafer attached to the substrate and covered by an etching mask.
Figure 3:
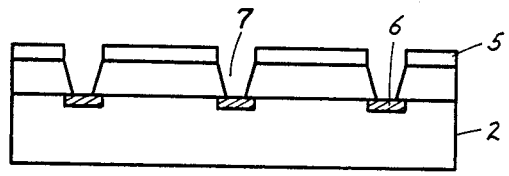
FIG. 3 shows the gallium arsenide wafer with via holes etched therein.

Processing continues with the thinning of the GaAs wafer by lapping and chemical polishing, from its starting thickness of approximately 400 micrometers to approximately 125 micrometers. Then, as shown in FIG. 2, an etch mask 5 having apertures 8 therein for forming via holes 7 and the like is aligned and patterned on the wafer 1 using standard back side alignment photolithography and evaporation techniques. The via hole or the like are then etched into the wafer using a standard etching plasma such as a mixture of "Freon 12" ($CCl_2F_2$) and argon. The etching is done in 20 to 30 minute intervals or continuously until all of the via holes 7 are etched through to the contact pads 6 (usually gold) on the front side of the wafer as shown in FIG. 3.

Figure 4:
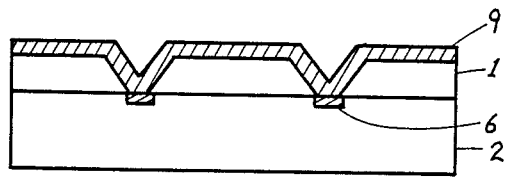
FIG. 4 shows the wafer with gold plating on the back side and via holes.

Processing of the wafer continues with the removal of the etching mask 5. As shown in FIG. 4, a gold plating 9 is then placed on the back side of the wafer.

After the gold plating, the gallium arsenide wafer is removed from the sapphire substrate by dissolving the adhesive in hot acetone. After wafer separation, the wafer is removed from the acetone, given a deionized water rinse, and dried by blowing a stream of nitrogen gas onto the wafer.

Final cleanup to remove adhesive from the front side of gallium arsenide wafer is done by an oxygen plasma etch. The wafer may then be diced into individual integrated circuits.

A substance which has been found to work well as an adhesive in this process is MICROPOSIT®FSC® SOLUTION manufactured by the Shipley company of Newton, Mass. The Solution is identified in Shipley brochure entitled "MICROPOSIT®FSC®SOLUTION, copyright July 1984. This product is advertised as a protective coating for use during chemical or mechanical processes during microelectronic fabrication which provides protection of damage prone surfaces on high value wafers from acid etchants, mechanical abrasion or particle contamination during back end processes. Thus the advertising teaches away from its use as a front end adhesive as stated herein.

While we have described above the principles of our invention in connection with specific apparatus, it is to be clearly understood that this description is made only by way of example an not as a limitation to the scope of our invention as set forth in the objects thereof and in the accompanying claims.

We claim:

1. A process for manufacturing integrated circuits comprising the steps of:
    providing a semiconductor wafer having a front side including metal contact pads and having a back side opposite said front side;
    spinning a nonphotosensitive acid resist onto said front side and baking and spinning additional acid resist onto a temporary substrate;
    placing said front side on the wet surface of said temporary substrate and baking to harden the adhesive acid resist;
    thinning said wafer to a thickness of approximately 125 um–150 um by lapping and polishing said back side;
    aligning and patterning an etch mask having apertures therein on the back side of the wafer;
    using a plasma etch to form holes in the wafer extending to said contact pads and depositing metal in said holes in contact with said pads; and
    removing said temporary substrate and said acid resist.

2. The process of claim 1 wherein said temporary substrate is sapphire.

3. The process of claim 1 wherein said acid resist is impervious to acid and does not change its chemical composition upon photographic exposure.

* * * * *